(12) United States Patent
Habara et al.

(10) Patent No.: US 11,614,506 B2
(45) Date of Patent: Mar. 28, 2023

(54) RADIO FREQUENCY COIL UNIT AND MAGNETIC RESONANCE IMAGING APPARATUS

(71) Applicant: Hitachi, Ltd., Tokyo (JP)

(72) Inventors: Hideta Habara, Tokyo (JP); Shinichirou Suzuki, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 24 days.

(21) Appl. No.: 17/329,318

(22) Filed: May 25, 2021

(65) Prior Publication Data
US 2022/0099765 A1 Mar. 31, 2022

(30) Foreign Application Priority Data
Sep. 28, 2020 (JP) ............................... JP2020-162034

(51) Int. Cl.
*G01R 33/34* (2006.01)
(52) U.S. Cl.
CPC .............................. *G01R 33/34076* (2013.01)
(58) Field of Classification Search
CPC .............................................. G01R 33/34076
See application file for complete search history.

(56) References Cited

U.S. PATENT DOCUMENTS

| 7,688,070 | B2 | 3/2010 | Weyers et al. | |
|---|---|---|---|---|
| 2006/0076955 | A1* | 4/2006 | Saylor | G01R 33/34046 324/318 |
| 2013/0300418 | A1* | 11/2013 | Eberler | G01R 33/34046 324/322 |
| 2019/0170837 | A1* | 6/2019 | Findeklee | G01R 33/34046 |

* cited by examiner

*Primary Examiner* — Dixomara Vargas
(74) *Attorney, Agent, or Firm* — Mattingly & Malur, PC

(57) ABSTRACT

A radio frequency coil unit performs at least one of transmission of a radio frequency signal to a subject placed in a static magnetic field and reception of a nuclear magnetic resonance signal generated from the subject. The radio frequency coil unit includes a radio frequency coil including a first ring conductor, a second ring conductor, a plurality of rung conductors that electrically connect the first ring conductor and the second ring conductor to each other, and a plurality of capacitors, and a cylindrical shield conductor surrounding the radio frequency coil. A distance between the second ring conductor and the shield conductor is shorter than a distance between the first ring conductor and the shield conductor. A width of the second ring conductor is smaller than a width of the first ring conductor.

7 Claims, 6 Drawing Sheets

RADIO FREQUENCY COIL UNIT AND MAGNETIC RESONANCE IMAGING APPARATUS

CROSS-REFERENCE TO RELATED APPLICATION

This application claims priority to Japanese Patent Application No. 2020-162034 filed on Sep. 28, 2020, the entire contents of which are incorporated by reference herein.

BACKGROUND OF THE INVENTION

The present invention relates to a radio frequency coil unit and a magnetic resonance imaging apparatus that uses the radio frequency coil unit.

A magnetic resonance imaging apparatus (hereinafter referred to as "MRI apparatus") irradiates, with a radio frequency signal (hereinafter referred to as "RF signal") that is an electromagnetic wave, a subject placed in a uniform static magnetic field generated by a static magnetic field magnet, excites nuclear spins in the subject, receives a nuclear magnetic resonance (NMR) signal that is an electromagnetic wave generated from the nuclear spins, and processes the received signal to acquire a magnetic resonance image of the subject.

As described above, the MRI apparatus irradiates the subject with the RF signal. An antenna device that is an RF antenna, an RF coil, or the like and transmits or receives an electromagnetic wave of a radio frequency irradiates the subject with the RF signal and receives the NMR signal. As the antenna device, a radio frequency coil unit that uses a birdcage coil is known (refer to, for example, U.S. Pat. No. 7,688,070).

Normally, as illustrated in FIG. 2, the birdcage coil is configured as follows. That is, the birdcage coil includes two circular ring conductors 203, a plurality of linear rung conductors 204, capacitors, diodes, a power supply cable (not illustrated), and the like. End portions of the rung conductors 204 arranged at equal intervals on a cylindrical surface are connected to the ring conductors 203. The capacitors are inserted in gaps 201 arranged at equal intervals in the ring conductors 203. The diodes are inserted in gaps 202 of the rung conductors 204.

In addition, the cylindrical birdcage coil 200 illustrated in FIG. 2 is surrounded by a cylindrical conductor that is referred to as RF shield (not illustrated). The capacitors included in the birdcage coil 200 are adjusted in such a manner that the birdcage coil resonates at a specific frequency in the MRI apparatus due to the RF shield, the rung conductors, and the ring conductors. Normally, the RF shield is disposed on an inner cylindrical surface of a cylindrical gradient magnetic field coil present outside the radio frequency coil unit.

The birdcage coil has a feature in which the range of a uniform space of an RF magnetic field (also referred to as "irradiation magnetic field") generated by the RF signal for the irradiation is wider than the range of uniform spaces of magnetic fields generated by a simple loop coil or a saddle coil. Due to this feature, the birdcage coil is currently used as a standard transmission coil for a tunnel-type horizontal magnetic field MRI apparatus.

SUMMARY OF THE INVENTION

In the radio frequency coil unit that uses the birdcage coil, a diameter A of the RF shield, diameters B and C of the two front and rear ring conductors 203, and a diameter D of a cylinder with a surface on which the rung conductors 204 connecting the two ring conductors 203 to each other are located are parameters important for design. Not only these parameters but also a diameter E of a cylindrical bore that is a space into which a patient is inserted are parameters important for the patient's comfort.

To form the radio frequency coil unit as a product, relationships between the magnitude of the diameters need to satisfy E<(B, C, and D)<A. Increasing the diameter A can improve the performance of the irradiation coil that generates the RF signal. In addition, since the diameter E can be increased by increasing the diameter A, the increase in the diameter A improves the patient's comfort. However, for the MRI apparatus, the size of the diameter A is determined based on the size of a static magnetic field magnet that generates a static magnetic field, and the size of the gradient magnetic field coil. Since the size of the static magnetic field coil directly relates to the cost of the product, it is not so desirable that the static magnetic field coil be increased in size.

On the other hand, it is desirable that distance between the cylindrical surface on which the ring conductors or the rung conductors are disposed and an inner cylindrical surface of the RF shield (or a difference between the diameter B, C or D and the diameter A) is large enough from the perspective of the irradiation efficiency of the RF signal. However, when the foregoing distance is increased, the diameter E is reduced. Thus, the increase in the distance is traded off against the patient's comfort. In this case, reducing distance between the cylindrical bore and the cylindrical surface on which the ring conductors or the rung conductors are disposed (or a difference between the diameters B, C or D and the diameter E) can suppress deterioration in the patient's comfort. However, the concerned portion has a cylindrical structure made of a material, such as fiber reinforced plastic (FRP), in which a space surrounded by the inner cylindrical surface of the cylindrical structure is the cylindrical bore and in which the ring conductors and the rung conductors are disposed on the outer cylindrical surface of the cylindrical structure. Thus, reducing the difference between the diameter B, C or D and the diameter E means a reduction in a thickness of the cylindrical structure and results in a reduction in mechanical strength. Therefore, the reduction in the difference of diameter is limited.

The diameters of the front and rear ring conductors 203 and the diameter of the cylinder on which the rung conductors 204 are disposed, that is the outer diameter of the cylindrical structure on which the rung conductors 204 are disposed, are the same (B=C=D) in general. However, an example in which the diameters of the ring conductors 203 are larger than the diameter of the cylindrical surface on which the rung conductors 204 are disposed (or (B=C)>D) is known as well. This structure can be achieved by making an outer diameter of a cylindrical structure in a region on which the ring conductors 203 are disposed different from an outer diameter of the cylindrical structure in a region on which the rung conductors 204 are disposed.

The structure in which ((B=C)>D) has an advantage and a disadvantage, compared with the structure in which (B=C=D). The advantage is that a strong electric field and a strong magnetic field that are generated from the ring conductors 203 have the smaller effect on a patient space (inner space of the cylindrical bore). In the patient space, cable conductors of receiving coils are present. When the cable conductors are coupled to magnetic fields generated the ring conductors 203, the cable conductors may generate heat. Increasing the diameters of the ring conductors can reduce such risk. The disadvantage is that the irradiation efficiency of the RF signal is reduced by reductions in the distances between the ring conductors 203 and the RF shield.

Therefore, in the present invention it has considered changing the diameter of the front ring conductor and the diameter of the rear ring conductor. For example, the diameter of the front (on the side on which a patient is inserted into the cylindrical bore) ring conductor of the cylindrical bore, which the patient is likely to approach and near which a reception cable is easy to be placed, increases. In such a case, it can be expected that the disadvantage caused by the increase in the diameter of the front ring conductor is reduced by keeping or improving the irradiation efficiency of the RF signal by making the diameter of the rear ring conductor being smaller than the diameter of the front ring conductor. However, by making the diameters of the two ring conductors different from each other, spatial uniformity of the irradiation magnetic field of the radio frequency coil unit becomes worse.

The present invention has been made under the foregoing circumstances, and an object of the present invention is to provide an RF coil that has a good balance between irradiation efficiency and an effect of an electromagnetic field generated from ring conductors while avoiding deterioration of spatial uniformity of an irradiation magnetic field.

A radio frequency coil unit according to an aspect of the present invention performs at least one of transmission of a radio frequency signal to a subject placed in a static magnetic field, or reception of a nuclear magnetic resonance signal generated from the subject. The radio frequency coil unit includes a radio frequency coil having a first ring conductor, a second ring conductor, a plurality of rung conductors that electrically connect the first ring conductor and the second ring conductor to each other, and a plurality of capacitors, and a cylindrical shield conductor surrounding the radio frequency coil. The first ring conductor, the second ring conductor, a cylindrical surface on which the rung conductors are disposed and the shield conductor are arranged in such a manner that each central axis matches the central axis of the radio frequency coil unit. First gaps are arranged at equal intervals in each of the first and second ring conductors in a circumferential direction of each of the first and second ring conductors. The rung conductors are arranged at equal intervals on the cylindrical surface in such a manner that portions of the first ring conductor that are sectioned by the first gaps are electrically connected to portions of the second ring conductor that are sectioned by the first gaps. The capacitors connect between the portions of the first ring conductor that are sectioned by the first gaps and between the portions of the second ring conductor that are sectioned by the first gaps. A distance between the second ring conductor and the shield conductor is shorter than the distance between the first ring conductor and the shield conductor. A width of the second ring conductor is smaller than the width of the first ring conductor.

An RF coil that has a good balance between irradiation efficiency and an effect of an electromagnetic field generated from ring conductors is provided while avoiding deterioration of spatial uniformity of an irradiation magnetic field.

Other challenges and new features will be clarified from the description of the present specification and the accompanying drawings.

DETAILED DESCRIPTION OF THE PREFERRED EMBODIMENTS

Hereinafter, a radio frequency coil unit according to an embodiment of the present invention and an MRI apparatus in which the radio frequency coil unit is used are described with reference to the drawings.

Entire Configuration of MRI Apparatus

Figure 1:
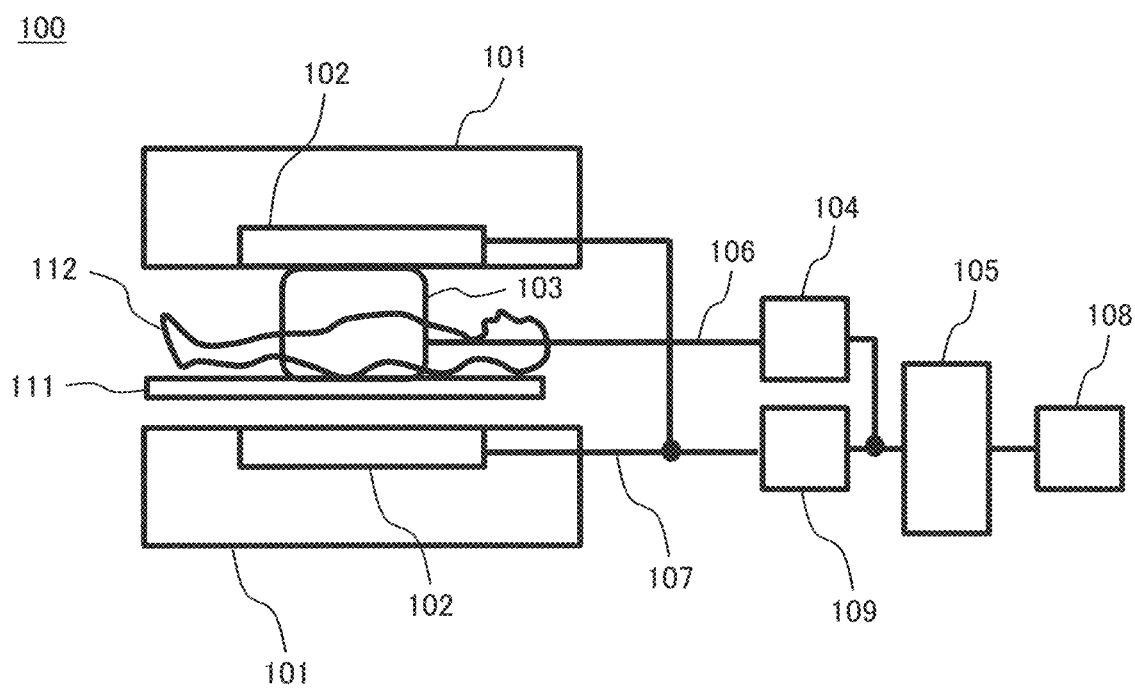
FIG. 1 is a schematic configuration diagram of an MRI apparatus.

FIG. 1 is a schematic configuration diagram of an MRI apparatus 100. The MRI apparatus 100 includes a magnet 101, an gradient magnetic field coil 102, an RF antenna 103, a transceiver 104, an gradient magnetic field power supply 109, a data processing unit 105, a display device 108, and a bed 111. The magnet 101 forms a static magnetic field in a measurement space in which a subject 112 is placed. The gradient magnetic field coil 102 applies a magnetic field gradient to the static magnetic field in a predetermined direction. The RF antenna 103 transmits a radio frequency signal (RF signal) to the subject 112 and receives a nuclear magnetic resonance signal (NMR signal) generated from the subject 112. The transceiver 104 generates a pulse waveform of the RF signal (RF wave) and transmits the RF signal with the pulse waveform to the RF antenna 103. The transceiver 104 also processes the NMR signal received by the RF antenna 103. The gradient magnetic field power supply 109 supplies a current to the gradient magnetic field coil 102. The data processing unit 105 controls driving of the transceiver 104 and driving of the gradient magnetic field power supply 109 and receives instructions to execute various types of information processing and an operation by an operator. The display device 108 displays processing results of the data processing unit 105. The subject 112 is placed on the bed 111.

The gradient magnetic field power supply 109 and the gradient magnetic field coil 102 are connected to each other via an gradient magnetic field control cable 107. The RF antenna 103 and the transceiver 104 are connected to each other via a transmission/reception cable 106. The transceiver 104 includes a synthesizer, a power amplifier, a reception mixer, an analog-to-digital converter, and a transmission/reception switch (that are not illustrated).

The RF antenna 103 resonates at a predetermined frequency and includes a multi-channel transmitting or transmitting/receiving antenna with two or more channels.

In the example illustrated in FIG. 1, as the RF antenna 103 that transmits the RF signal and receives the NMR signal, a single RF antenna is used. However, the RF antenna 103 is not limited to this. For example, as the RF antenna 103, an RF antenna composed of a plurality of antennas, such as a combination of an RF antenna for wide-range imaging and an RF antenna for narrow-range imaging, may be used.

Especially, when each human portion is to be imaged in detail, a transmitting antenna and a receiving antenna that are different from each other are used in most cases. In many cases, a large irradiation antenna that is disposed in an gradient magnetic field coil to cover a whole human body is used for transmission while a local antenna disposed near a surface of the human body is used for reception. The local antenna is dedicated for reception in many cases.

As the MRI apparatus 100, a horizontal magnetic field type MRI apparatus or a vertical magnetic field type MRI apparatus is used based on a direction of a static magnetic field generated by the magnet 101. In general, in the horizontal magnetic field type MRI apparatus in which the RF coil unit according to the embodiment is used, the magnet 101 has a cylindrical bore (central space) and generates a static magnetic field in a left-right direction (direction that matches a central axis of the RF coil unit) in FIG. 1. The horizontal magnetic field type MRI apparatus is referred to as tunnel type MRI apparatus.

The data processing unit 105 controls the transceiver 104 and the gradient magnetic field power supply 109 to cause the RF antenna 103 and the gradient magnetic field coil 102 to intermittently irradiate the subject 112 placed in the static magnetic field with the RF signal and apply an gradient magnetic field to the static magnetic field. In addition, atomic nuclei in the subject 112 resonate with the RF signal and the RF antenna 103 receives the NMR signal generated from the subject 112. The data processing unit 105 processes the received NMR signal and reconstructs an image of the subject 112. The subject 112 is, for example, a predetermined human portion.

Configuration of RF Transmission and Reception System

Figure 3:
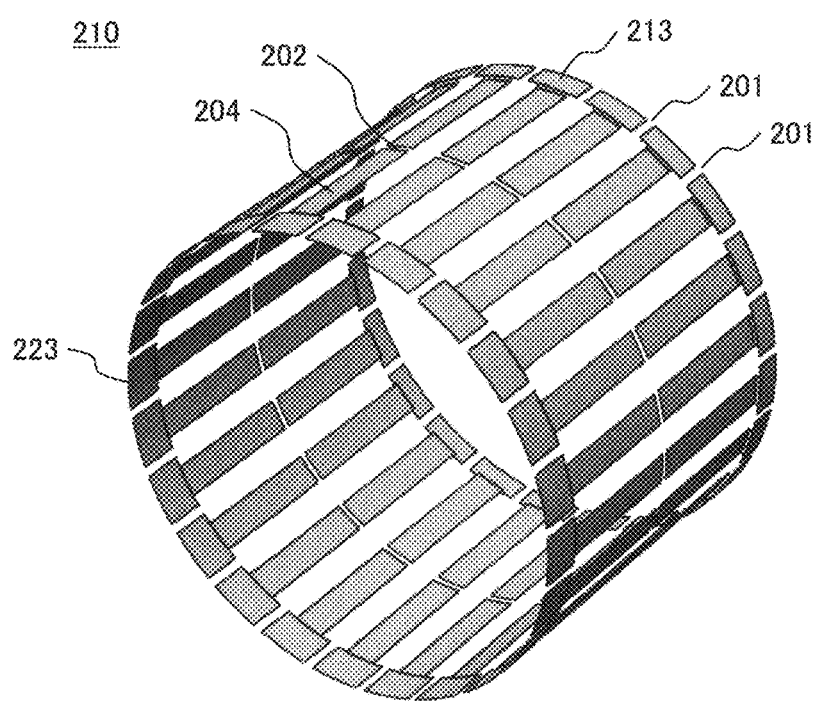
FIG. 3 is a perspective view of a birdcage coil according to an embodiment.

As the RF antenna 103 according to the embodiment, a birdcage coil (hereinafter merely referred to as "RF coil") 210 illustrated in FIG. 3 is used. The RF coil 210 is surrounded by an RF shield configured by forming a sheet conductor in a cylindrical shape and constitutes the radio frequency coil unit. The RF coil 210 illustrated in FIG. 3 includes two circular ring conductors 213 and 223, a plurality of linear rung conductors 204, capacitors, diodes, and a power supply cable (not illustrated).

The ring conductors 213 and 223 are disposed at both ends of the RF coil 210 and serve as end rings. The ring conductors 213 and 223 and the rung conductors 204 are arranged in such a manner that central axes of the ring conductors 213 and 223 match a central axis of a cylindrical surface on which the rung conductors 204 are disposed. Gaps 201 are arranged at equal intervals in each of the ring conductors 213 and 223 in a circumferential direction of each of the ring conductors 213 and 223. The rung conductors 204 are arranged at equal intervals on the cylindrical surface. Each of portions of the ring conductor 213 that are sectioned by the gaps 201 and each of portions of the ring conductor 223 that are sectioned by the gaps 201 are connected to both end portions of each of the rung conductors 204.

The capacitors are inserted in the gaps 201 arranged at the equal intervals in the ring conductors 213 and 223 and are connected between the portions of the ring conductors that are sectioned by the gaps 201. The diodes are inserted in gaps 202 of the rung conductors 204 and connected between portions of the rung conductors 204 that are sectioned by the gaps 202. The capacitors are adjusted in such a manner that the RF coil resonates at a frequency of a radio frequency signal or a frequency of a nuclear magnetic resonance signal depending on the dimensions of the ring conductors 213 and 223, the rung conductors 204, and the RF shield.

Figure 2:
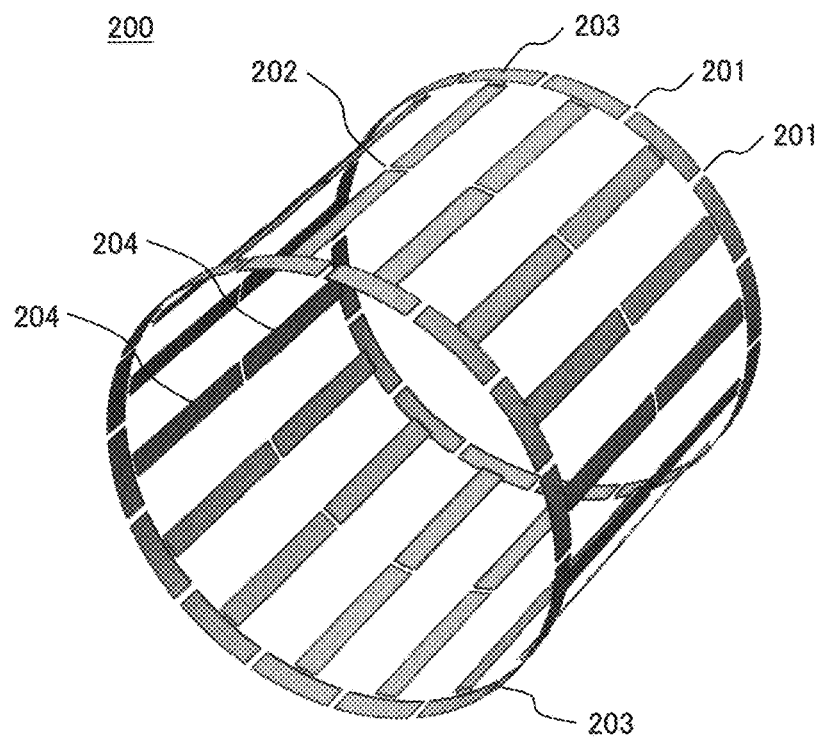
FIG. 2 is a perspective view of a conventional birdcage coil.

The RF coil 210 illustrated in FIG. 3 is different from the conventional birdcage coil 200 illustrated in FIG. 2 in that diameters of the two rings conductors 213 and 223 of the RF coil 210 are different from each other.

Figure 4:
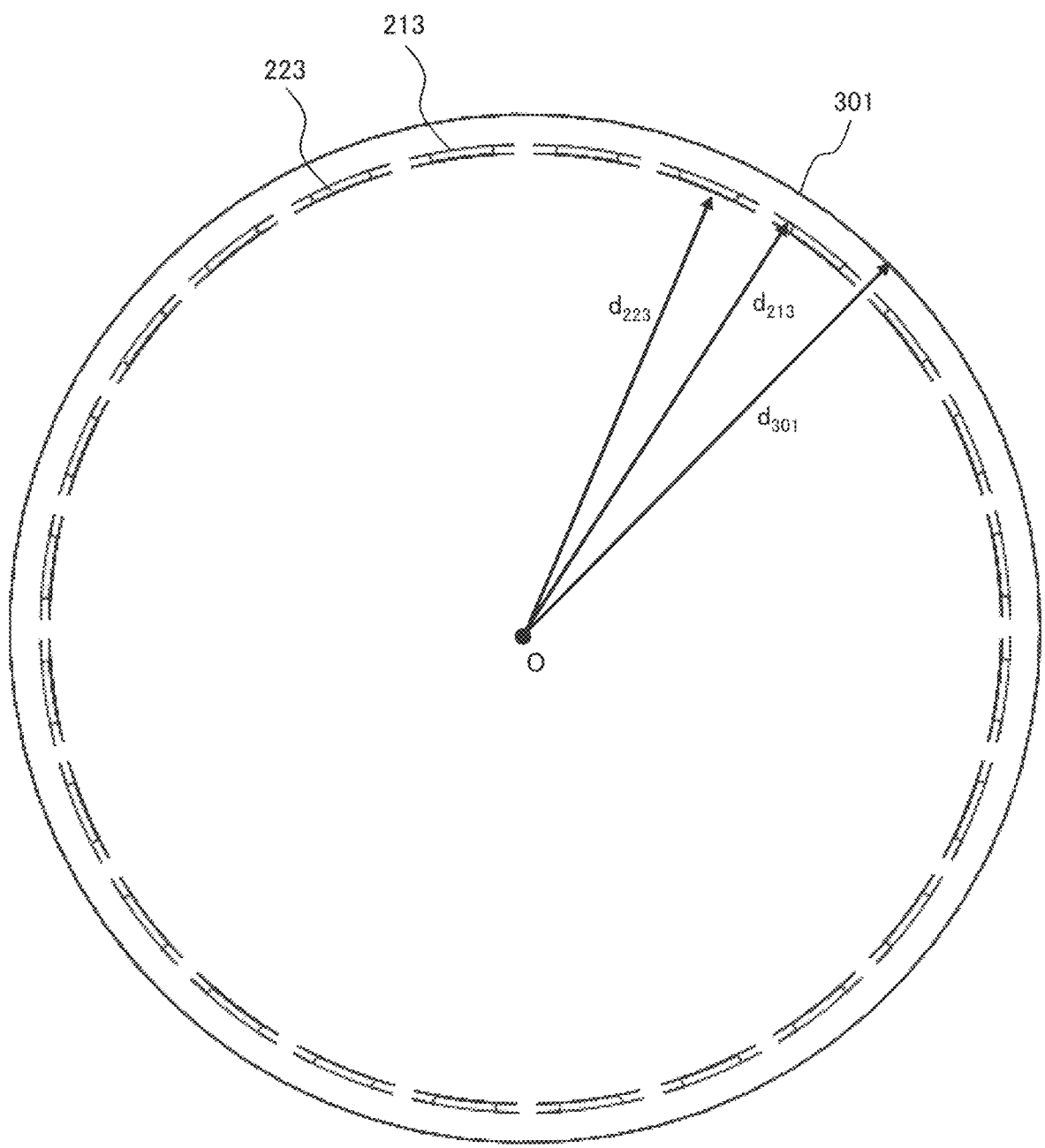
FIG. 4 is a schematic cross-sectional view of a radio frequency coil unit with a cross-sectional surface perpendicular to a central axis of the radio frequency coil unit.

FIG. 4 is a schematic cross-sectional view of the radio frequency coil unit. The cross-sectional view illustrates a cross-sectional surface perpendicular to the central axis O of the radio frequency coil unit. A central axis of the RF coil 210 matches a central axis of the cylindrical RF shield and is illustrated as the central axis O. The cross-sectional view illustrates a cross-sectional surface of the ring conductor 223 with a small diameter, a cross-sectional surface of the ring conductor 213 with a large diameter, and a cross-sectional surface of a shield conductor 301 that constitutes the RF shield. The diameter $d_{213}$ of the ring conductor 213, the diameter $d_{223}$ of the ring conductor 223, and a diameter $d_{301}$ of the shield conductor 301 have relationships of $d_{223} < d_{213} < d_{301}$.

Figure 5:
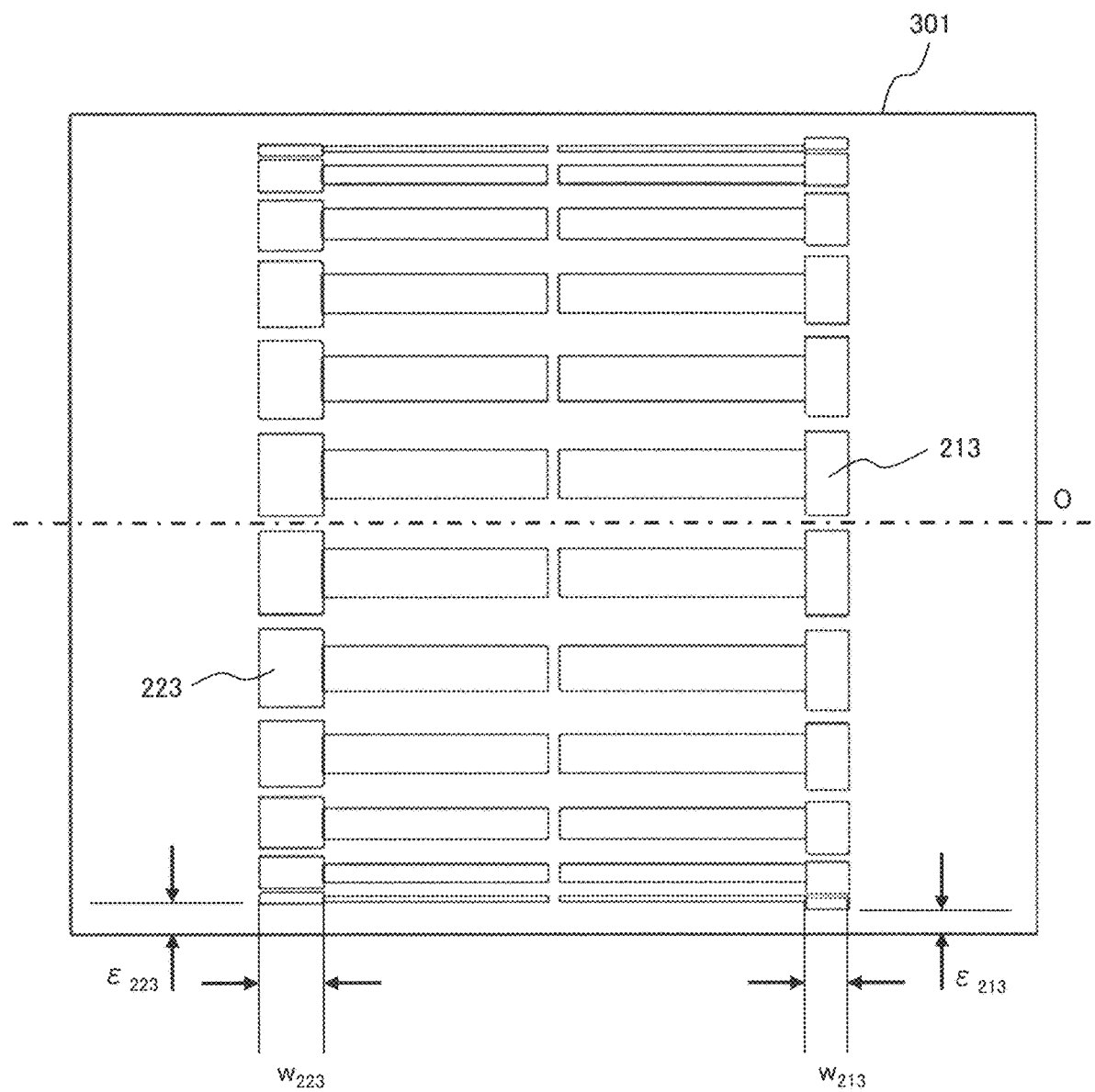
FIG. 5 is a schematic cross-sectional view of the radio frequency coil unit with a cross-sectional surface including the central axis of the radio frequency coil unit.

FIG. 5 is a schematic cross-sectional view of the radio frequency coil unit with a cross-sectional surface including the central axis O. Since the diameter of the ring conductor 213 is different from the diameter of the ring conductor 223, a distance $\varepsilon_{213}$ between the ring conductor 213 and the shield conductor 301 and a distance $\varepsilon_{223}$ between the ring conductor 223 and the shield conductor 301 have a relationship of $\varepsilon_{213} < \varepsilon_{223}$. The difference between the distances causes a reduction in spatial uniformity of an irradiation magnetic field of an RF signal with which the RF coil 210 irradiates the subject 112. To avoid this, the present inventors have found that adjusting widths of the ring conductors 213 and 223 can suppress a reduction in the spatial uniformity of the irradiation magnetic field of the RF signal.

Specifically, the width $w_{213}$ of the ring conductor 213 and the width $w_{223}$ of the ring conductor 223 have a relationship of $w_{213} < w_{223}$. Reducing the width of the ring conductor 213 closer to the shield conductor of the RF shield than the other ring conductor 223 makes it possible to achieve the radio frequency coil unit that has a good balance between the irradiation efficiency and an effect of an electromagnetic field generated from the ring conductors and to acquire a high-definition MRI image without significantly reducing spatial uniformity of an irradiation magnetic field.

A magnetic field distribution generated by the RF coil is described below. A current computation technique can calculate a magnetic field distribution of the RF coil used in the MRI apparatus by simulating the magnetic field distribution in such a manner that the simulated distribution is almost the same as a real magnetic field distribution of the RF coil. The magnetic field distribution calculated via the simulation is described below.

Figure 6:
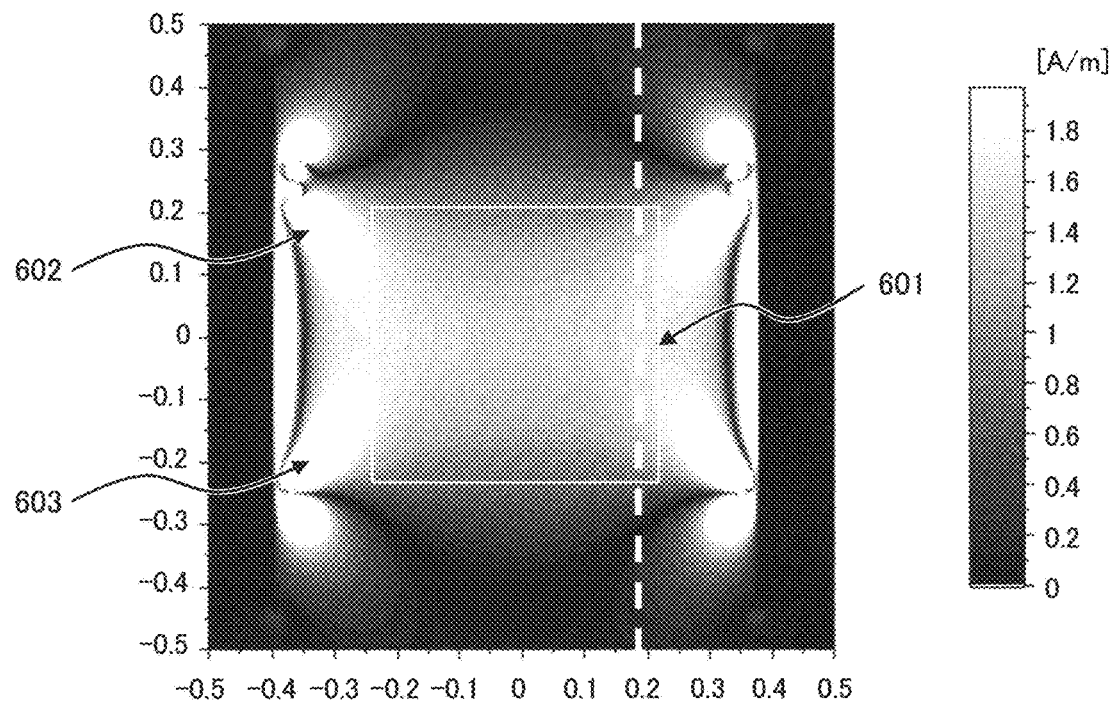
FIG. 6 is a diagram illustrating a magnetic field intensity map of an RF magnetic field generated by an RF coil according to the embodiment.

FIG. 6 illustrates an RF magnetic field map on a cross-sectional surface including a cylindrical axis of an RF magnetic field ($B_1^+$ circularly polarized wave magnetic field) generated by the RF coil 210 illustrated in FIG. 3. The $B_1^+$ circularly polarized wave magnetic field is a magnetic field that is included in a magnetic field $B_1$ generated by the RF coil and has a wave circularly polarized in a direction in which a hydrogen nuclear spin is excited.

A portion to be imaged is placed in a central part of the RF magnetic field map illustrated in FIG. 6 and is imaged by the MRI apparatus. Each of the unit of the abscissa and the unit of the ordinate is meter. An imageable range is limited to a uniform magnetic field region generated by the static magnetic field magnet and normally has a radius of approximately 0.25 m from the center of the imageable range. An image of a region that is out of the imageable range may be distorted or the region may neither be imaged nor acquired. Therefore, as performance required for the RF coil, the uniformity of an RF magnetic field generated in a sphere with a radius of 250 mm from the center of the sphere is requested. A displayed region illustrated in FIG. 6 and surrounded by a white square frame having vertical and horizontal sides with their centers that are 250 mm away from the center of the white square frame is referred to as imageable region 601.

FIG. 6 illustrates the magnetic field map represented in gray scale and indicating the magnetic field generated when power of 12 watts is input to each of two input terminals with 24 watts in total. On the magnetic field map, the central axis of the RF coil 210 extends in a vertical direction of FIG. 6, the ring conductor 223 is located on the upper side, and the ring conductor 213 is located on the lower side. The gray scale indicates intensities in a range of 0 to 2 (A/m). Nothing placed at the center of the magnetic field. The magnetic field map indicates the magnetic field generated without a load.

Figure 7:
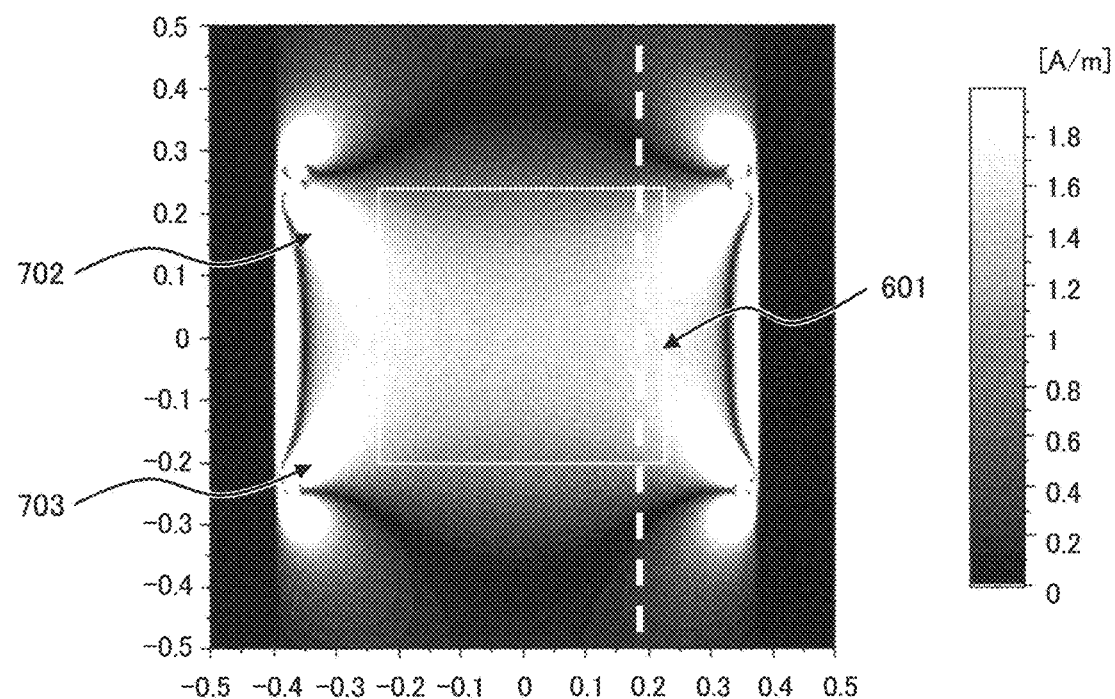
FIG. 7 is a diagram illustrating a magnetic field intensity map of an RF magnetic field generated by an RF coil according to a comparative example.

FIG. 7 illustrates an RF magnetic field map indicating a magnetic field distribution calculated by simulating a magnetic field generated by an RF coil according to a comparative example in the same manner as described above. The RF coil according to the comparative example has ring conductors 213 and 223 with widths $w_{213}$ and $w_{223}$ that are the same, compared with the RF coil illustrated in FIGS. 3 to 5 and subjected to the simulation described with reference to FIG. 6. In a normal birdcage coil, widths of front and rear ring conductors are the same. Therefore, it can be said that a diameter of only one of the ring conductors is increased and a distance between the ring conductor with the increased diameter and a shield conductor of an RF shield is reduced in the conventional birdcage coil. In this case, a central axis of an RF coil extends in a vertical direction of FIG. 7 and a distance between a ring conductor and the shield conductor illustrated on the lower side of FIG. 7 is smaller than a distance between a ring conductor and the shield conductor illustrated on the upper side of FIG. 7.

From each of FIGS. 6 and 7, it is found that four white portions (with magnetic field intensities of higher than 2) are present near four corners of the imageable region 601. In the case illustrated in FIG. 7, it is found that the two white portions 702 present on the upper side spread more widely than the two white portions 703 present on the lower side. On the other hand, it is found that a difference between the spread of the two white portions 602 present on the upper side of FIG. 6 and the spread of the two white portions 603 present on the lower side of FIG. 6 is smaller than that in the case illustrated in FIG. 7. Specifically, a difference between the uniformity of the magnetic field on the upper side of FIG. 7 and the uniformity of the magnetic field on the lower side of FIG. 7 is noticeable, but a difference between the uniformity of the magnetic field on the upper side of FIG. 6 and the uniformity of the magnetic field on the lower side of FIG. 6 is suppressed.

Figure 8:
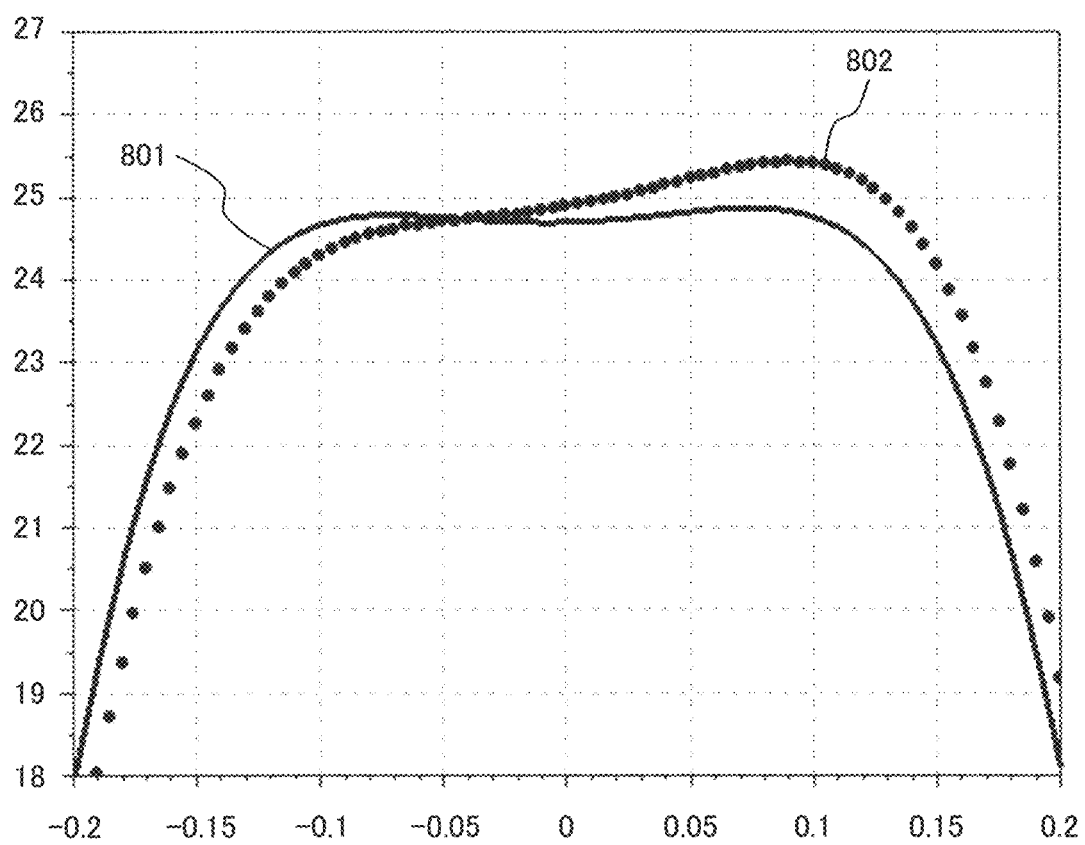
FIG. 8 is a diagram illustrating line profiles of magnetic field intensities on lines parallel to central axes of the RF coils according to the embodiment and the comparative example.

FIG. 8 illustrates, as line profiles, magnetic field distributions taken along white dotted lines illustrated in FIGS. 6 and 7. The abscissa indicates a coordinate in a direction parallel to the central axes of the RF coils, and the ordinate indicates a magnetic field intensity. A solid line 801 indicates the line profile of the RF coil according to the embodiment while a dotted line 802 indicates the line profile of the RF coil according to the comparative example. Each of positions that are the closest to the centers of the magnetic fields is indicated by a value of 0 on the abscissa. It is found that, while an inclination of the line profile indicated by the dotted line 802 (comparative example) at the center of the magnetic field is steep and rises to the right, an inclination of the line profile indicated by the solid line 801 (embodiment) at the center of the magnetic field is gentle and the uniformity of magnetic field intensities indicated by the solid line 801 in a range of −0.1 m to 0.1 m on the abscissa is improved.

A table 1 indicates that maximum values, minimum values, and standard deviations of magnetic field intensities in a range of ±0.2 m from the center of the magnetic field in the radius direction (horizontal direction in FIGS. 6 and 7) and ±0.1 m from the center of the magnetic field in the central axis direction (vertical direction in FIGS. 6 and 7) for the embodiment (FIG. 6) and the comparative example (FIG. 7), while each of the centers of the magnetic fields is standardized to be 1.

TABLE 1

|  | Minimum Value | Maximum Value | Standard Deviation |
|---|---|---|---|
| Embodiment | 0.908 | 1.133 | 0.053 |
| Comparative Example | 0.889 | 1.141 | 0.056 |

For imaging of a region for which uniformity of irradiation magnetic field is required or for imaging of a head portion or the like, it is desirable that the maximum value and the minimum value be close to 1 and thus the standard deviation be small. In the embodiment, the balance is kept by making the width of the ring conductor 213 smaller than the width of the ring conductor 223. However, if the width of the ring conductor 213 is further reduced, the balance is not kept and the performance deteriorates. The standard deviation in the embodiment and the standard deviation in the comparative example are 0.053 and 0.056, respectively. Thus, the standard deviation in the embodiment is smaller by approximately 6% than the standard deviation in the comparative example. It is desirable that the widths of the ring conductors be adjusted in such a manner that the standard deviation of magnetic field intensities in the region (region from which the values indicated in the table 1 are calculated) corresponding to the imaged human head portion is equal to or smaller than 0.055.

Some examples of specifications of the RF coil 210 according to the embodiment are a diameter of approximately 710 mm and an entire length of approximately 550 mm. In the RF coil 210, the capacitors are disposed only in the portions of the ring conductors, and such birdcage coil is also referred to as high-pass coil. The number of rung conductors is 24. The diodes are disposed in the central cut portions of the rung conductors. For a time period for which the subject is not irradiated with the RF signal, the coupling of the RF coil 210 to a reception coil is prevented, and thus the diodes are inversely biased and the coil does not resonate. The RF coil can be used for a 1.5 Tesla tunnel-type MRI apparatus. When values of the 24 capacitors disposed in each of the ring conductors disposed at both ends of the RF coil are 200 pF, the RF coil resonates at 63.8 MHz that is an RF resonance frequency of the 1.5 Tesla MRI apparatus.

REFERENCE SIGNS LIST

100: MRI apparatus
101: magnet

102: gradient magnetic field coil
103: RF antenna
104: transceiver
105: data processing unit
106: transmission/reception cable
107: gradient magnetic field control cable
108: display device
109: gradient magnetic field power supply
111: bed
112: subject
200, 210: birdcage coil
201, 202: gap
203, 213, 223: ring conductor
204: rung conductor
301: shield conductor
601: imageable region
602, 603, 702, 703: region with strong magnetic field
801, 802: line profile

What is claimed is:

1. A radio frequency coil unit that performs at least one of transmission of a radio frequency signal to a subject placed in a static magnetic field and reception of a nuclear magnetic resonance signal generated from the subject, comprising:
 a radio frequency coil including a first ring conductor, a second ring conductor, a plurality of rung conductors, disposed on a cylindrical surface, that electrically connect the first ring conductor and the second ring conductor to each other, and a plurality of capacitors; and
 a cylindrical shield conductor surrounding the radio frequency coil,
 wherein the first ring conductor, the second ring conductor, the cylindrical surface and the shield conductor have respective axes that are parallel to a central axis of the radio frequency coil unit,
 wherein first gaps are arranged at equal intervals in each of the first and second ring conductors in a circumferential direction of each of the first and second ring conductors, and the rung conductors are arranged at equal intervals on the cylindrical surface in such a manner that portions of the first ring conductor that are sectioned by the first gaps are electrically connected to portions of the second ring conductor that are sectioned by the first gaps,
 the capacitors are connected between the portions of the first ring conductor that are sectioned by the first gaps and between the portions of the second ring conductor that are sectioned by the first gaps, and
 a first distance between the second ring conductor and the shield conductor is shorter than a second distance between the first ring conductor and the shield conductor, and a first width of the second ring conductor is smaller than a second width of the first ring conductor.

2. The radio frequency coil unit according to claim 1,
 wherein each of the rung conductors is sectioned by a second gap into a portion connected to the first ring conductor and a portion connected to the second ring conductor, and
 wherein a diode is connected between the portions of the rung conductor that are sectioned by the second gap.

3. The radio frequency coil unit according to claim 1,
 wherein a standard deviation of magnetic field intensities in a region corresponding to an image of a human head portion and having a center at the center of a radio frequency magnetic field generated by the radio frequency coil is equal to or smaller than 0.055.

4. The radio frequency coil unit according to claim 3,
 wherein the radio frequency magnetic field is a magnetic field circularly polarized in a direction in which a hydrogen nuclear spin is excited.

5. The radio frequency coil unit according to claim 4,
 wherein the region corresponding to the image of the human head portion is in a range of ±0.2 m from the center of the magnetic field in a radius direction of the radio frequency coil and is in a range of ±0.1 m from the center of the magnetic field in a central axis direction of the radio frequency coil.

6. A magnetic resonance imaging apparatus comprising:
 the radio frequency coil unit according to claims 1;
 a magnet that generates the static magnetic field; and
 an gradient magnetic field coil that applies a magnetic field gradient to the static magnetic field in a predetermined direction,
 wherein the radio frequency coil unit is disposed on an inner cylindrical surface of the gradient magnetic field coil in such a manner that a central axis of the radio frequency coil unit matches orientation of the static magnetic field generated by the magnet.

7. The magnetic resonance imaging apparatus according to claim 6,
 wherein a cylindrical bore into which the subject is inserted is formed on an inner side of the radio frequency coil unit,
 wherein the cylindrical bore has a first opening from which the subject is inserted into the cylindrical bore, and
 wherein the first ring conductor of the radio frequency coil unit is disposed on a side on which the first opening of the cylindrical bore is present.

* * * * *